United States Patent
Suzuki et al.

(10) Patent No.: US 12,342,655 B2
(45) Date of Patent: Jun. 24, 2025

(54) N-TYPE SNS THIN FILM, PHOTOELECTRIC CONVERSION ELEMENT, SOLAR CELL, METHOD FOR MANUFACTURING N-TYPE SNS THIN FILM, AND MANUFACTURING APPARATUS OF N-TYPE SNS THIN FILM

(71) Applicants: TOHOKU UNIVERSITY, Sendai (JP); UNIVERSITY OF YAMANASHI, Kofu (JP)

(72) Inventors: Issei Suzuki, Sendai (JP); Sakiko Kawanishi, Sendai (JP); Hiroshi Yanagi, Kofu (JP)

(73) Assignees: TOHOKU UNIVERSITY, Sendai (JP); UNIVERSITY OF YAMANASHI, Kofu (JP)

( * ) Notice: Subject to any disclaimer, the term of this patent is extended or adjusted under 35 U.S.C. 154(b) by 0 days.

(21) Appl. No.: 18/010,599

(22) PCT Filed: May 6, 2021

(86) PCT No.: PCT/JP2021/017400
§ 371 (c)(1),
(2) Date: Dec. 15, 2022

(87) PCT Pub. No.: WO2021/261089
PCT Pub. Date: Dec. 30, 2021

(65) Prior Publication Data
US 2023/0261130 A1 Aug. 17, 2023

(30) Foreign Application Priority Data
Jun. 23, 2020 (JP) ................................. 2020-108143

(51) Int. Cl.
*H10F 77/12* (2025.01)
*H10F 10/14* (2025.01)
*H01L 21/02* (2006.01)
*H10F 71/00* (2025.01)

(52) U.S. Cl.
CPC ........... *H10F 77/127* (2025.01); *H10F 10/14* (2025.01); *H10F 77/12* (2025.01);
(Continued)

(58) Field of Classification Search
CPC ..... H01L 31/068; H10F 77/12; H10F 77/127; H10F 10/14
See application file for complete search history.

(56) References Cited

FOREIGN PATENT DOCUMENTS

| CN | 102503161 A | 6/2012 |
| CN | 103928576 A | 7/2014 |

(Continued)

OTHER PUBLICATIONS

Gupta et al. "Optimization of SnS active layer thickness for solar cell application". 2017 J. Semicond. 38 113001. (Year: 2017).*
(Continued)

*Primary Examiner* — Lindsey A Buck
(74) *Attorney, Agent, or Firm* — Troutman Pepper Locke, LLP; Tim Tingkang Xia, Esq.

(57) ABSTRACT

This n-type SnS thin-film has n-type conductivity, an average thickness thereof is 0.100 μm to 10 μm, a ratio ($\alpha_{1.1}/\alpha_{1.6}$) of an absorption coefficient $\alpha_{1.1}$ at a photon energy of 1.1 eV to an absorption coefficient $\alpha_{1.6}$ at a photon energy of 1.6 eV is 0.200 or less, an atomic ratio of an S content to an Sn content is 0.85 to 1.10.

10 Claims, 2 Drawing Sheets

(52) U.S. Cl.
CPC .... *H01L 21/0242* (2013.01); *H01L 21/02568* (2013.01); *H01L 21/02576* (2013.01); *H01L 21/02631* (2013.01); *H10F 71/00* (2025.01)

(56) References Cited

FOREIGN PATENT DOCUMENTS

| CN | 105016378 A | 11/2015 |
| JP | 08176814 A | 7/1996 |
| JP | 2011513595 A | 4/2011 |
| JP | 2019178012 A | 10/2019 |
| WO | 2009112388 A2 | 9/2009 |

OTHER PUBLICATIONS

Iguchi et al. "Single-Crystal Growth of Cl-Doped n-Type SnS Using SnCl2 Self-Flux". Inorg. Chem. 2018, 57, 6769-6772. (Year: 2018).*

Spalatu et al. "Postdeposition Processing of SnS Thin Films and Solar Cells: Prospective Strategy to Obtain Large, Sintered, and Doped SnS Grains by Recrystallization in the Presence of a Metal Halide Flux". ACS Appl. Mater. Interfaces 2019, 11, 17539-17554. (Year: 2019).*

Office Action Issued by the State Intellectual Property Office of the Peoples Republic of China for Application No. 202180042777.2, Sep. 25, 2023, China.

Hiroshi Yanagi et al., N-type conduction in SnS by anion substitution with Cl, The Japan Society of Applied Physics, pp. 051201-1-051201-3.

Japan Patent Office, "International Search Report for PCT Application No. PCT/JP2021/017400", Japan, Jul. 13, 2021.

Fan-Yong Ran et al., n-type conversion of SnS by isovalent ion substitution: Geometrical doping as a new doping route, Sci. Rep., 5, 10428, 2015.

Gisa Grace Ninan et al., Solar Energy Materials & Solar Cells, 2016, vol. 157, pp. 229-233.

T.H. Sajeesh et al., Thin Solid Films, 2010, vol. 518, pp. 4370-4374.

* cited by examiner (a) EXAMPLE
(b) COMPARATIVE EXAMPLE
(c) ICSD

N-TYPE SNS THIN FILM, PHOTOELECTRIC CONVERSION ELEMENT, SOLAR CELL, METHOD FOR MANUFACTURING N-TYPE SNS THIN FILM, AND MANUFACTURING APPARATUS OF N-TYPE SNS THIN FILM

CROSS-REFERENCE TO RELATED PATENT APPLICATION

This application claims priority to Japanese Patent Application No. JP-A-2020-108143 filed on Jun. 23, 2020, the content of which is incorporated herein by reference.

FIELD OF THE INVENTION

The present invention relates to an n-type SnS thin film, a photoelectric conversion element, a solar cell, a method for manufacturing an n-type SnS thin film, and a manufacturing apparatus of an n-type SnS thin film.

BACKGROUND OF THE INVENTION

Currently, solar cells are widely used, but there is a need to reduce manufacturing costs and improve efficiency in order to spread the solar cells further. In order to reduce the manufacturing costs and improve the efficiency, it is necessary to develop a new mechanism and a low-cost material and process that achieve high efficiency.

A solar cell material suitable for high efficiency includes, for example, GaAs, Cu(In, Ga) Se$_2$ (CIGS), and CdTe, but there are problems that GaAs contains Ga, which is a rare metal, and As, which is a harmful element, and CIGS contains In and Ga, which are rare metals. Further, there is a problem that CdTe contains Te, which is the rare element, and Cd, which is a harmful element.

An example of the solar cell material having low toxicity and low raw material costs is SnS. Further, SnS is a material having a direct gap of 1.3 eV and an indirect gap of 1.1 eV, and theoretical limit conversion efficiency exceeding 30%. Since a light absorption coefficient α of SnS at 2 eV is $10^5$ cm$^{-1}$ or more, SnS can sufficiently absorb light with a thickness of about 2 to 3 μm. In addition, SnS also has an advantage that a thin film can be formed by a general-purpose process.

Since a SnS solar cell manufactured so far does not have an n-type SnS thin film, a heterojunction solar cell using another semiconductor thin film (such as CdS thin film) for an n-type layer has been mainly used. The conversion efficiency of the SnS solar cell fabricated so far is 4.4%, which is only a result much lower than the theoretical limit conversion efficiency. This is because the SnS solar cell in the related art uses a heterojunction in which a p-type semiconductor and an n-type semiconductor are made of different materials. In a case of the heterojunction, offset (ΔE) between energy at the upper end of a valence band of the p-type semiconductor and energy at the lower end of a conduction band of the n-type semiconductor at an interface serves as an indicator of an extracted voltage. However, since SnS has high energy at the lower end of the conduction band, ΔE is relatively small in a case of the heterojunction, so that an open circuit voltage is low and the conversion efficiency is low. For example, in a case of a CIGS solar cell having a heterojunction of CIGS and CdS, the open circuit voltage is 700 mV, whereas in a case of SnS solar cell having a heterojunction of SnS and CdS, the open circuit voltage is 200 mV. If the n-type SnS thin film can be obtained, it is expected that a homo pn junction using SnS in both a p-type layer and an n-type layer can be implemented, and a highly efficient solar cell can be obtained by improving the open-circuit voltage.

With respect to SnS, since vapor pressure of S (vapor pressure at 500° C.: 4×10$^5$ Pa) is much higher than vapor pressure of Sn (vapor pressure at 500° C.: 1×10$^{-6}$ Pa), SnS has a problem in that a defect in which Sn occupies a place to be occupied by S is likely to occur. When there is such a defect, since holes are generated in order to preserve electrical neutrality, SnS is likely to be the p-type semiconductor.

As the n-type SnS, PTL 1 discloses n-type SnS in which Br is added to SnS (tin sulfide). Non-PTL 1 discloses an n-type SnS thin film in which Pb is added to SnS.

CITATION LIST

Patent Document

JP-A-2019-178012.

Non-Patent Literature

Fan-Yong Ran et al. n-type conversion of SnS by isovalent ion substitution: Geometrical doping as a new doping route. Sci. Rep. 5, 10428.

SUMMARY OF THE INVENTION

Technical Problem

However, since the n-type SnS described in PTL 1 is a sintered body and has a low activation rate, it is necessary to add 0.4 at % or more of Br in order to exhibit n-type conductivity. Here, the activation rate refers to a ratio indicating how many carriers (conduction electrons and holes) are emitted by an implanted impurity. In addition, in the case of PTL 1, a spark plasma sintering method is used to obtain a sintered body. This method is for preparing a bulk sample, and the same method cannot be used to obtain the SnS thin film.

The n-type SnS thin film described in Non-PTL 1 implements n-type conversion by containing 20 at % or more of Pb, and has a low activation rate. In addition, since 20 at % or more of Pb, which is a harmful element, is contained, a merit of SnS that harmful element is contained as less as possible disappears.

The invention has been made in view of the above problems, and an object thereof is to provide an n-type SnS thin film that has a high impurity activation rate and exhibits n-type conductivity, a photoelectric conversion element, a solar cell, a method for manufacturing an n-type SnS thin film, and a manufacturing apparatus of an n-type SnS thin film.

Solution to Problem

As a result of intensive studies, the inventors have found that a SnS thin film exhibits n-type conductivity when an average thickness thereof is a predetermined thickness, an atomic ratio (S/Sn) of a S content to an Sn content satisfies a certain relation, and a ratio of an absorption coefficient $\alpha_{1.1}$ at a photon energy of 1.1 eV to an absorption coefficient $\alpha_{1.6}$ at the photon energy of 1.6 eV satisfies a certain relation. A gist of the invention is as follows.

(1) An n-type SnS thin film according to an aspect of the invention has n-type conductivity, an average thickness thereof is 0.100 μm to 10 μm, a ratio ($\alpha_{1.1}/\alpha_{1.6}$) of an absorption coefficient $\alpha_{1.1}$ at a photon energy of 1.1 eV to an absorption coefficient $\alpha_{1.6}$ at a photon energy of 1.6 eV is 0.200 or less, and an atomic ratio (S/Sn) of a S content to a Sn content is 0.85 to 1.10.

(2) The n-type SnS thin film according to the above (1) may have an absolute value of an absorption coefficient of $1.0 \times 10^4$ cm$^{-1}$ or less at a photon energy of 1.0 eV.

(3) The n-type SnS thin film according to the above (1) or (2) may contain 0.002 at % to 0.2 at % of a halogen element.

(4) In the n-type SnS thin film according to the above (3), the halogen element may be any one or more of Cl, Br, and I.

(5) A photoelectric conversion element according to an aspect of the invention has a homo pn junction including the n-type SnS thin film according to any one of the above (1) to (4) and a p-type SnS thin film.

(6) A solar cell according to an aspect of the invention includes the photoelectric conversion element according to the above (5).

(7) A method for manufacturing an n-type SnS thin film according to an aspect of the invention, includes forming a SnS thin film by a vacuum film forming method in the presence of atomic S and a halogen element.

(8) In the method for manufacturing an n-type SnS thin film according to the above (7), the atomic S may be supplied by sulfur plasma.

(9) In the method for manufacturing an n-type SnS thin film according to the above (7), the atomic S is supplied by $H_2S$.

(10) In the method for manufacturing an n-type SnS thin film according to any one of the above (7) to (9), before forming the SnS thin film, a SnS target containing 5 at % to 15 at % of a halogen element is irradiated with plasma to supply a halogen element into a manufacturing apparatus in advance.

(11) In the method for manufacturing an n-type SnS thin film according to any one of the above (7) to (9), a halogen element is supplied into the SnS thin film with halogen gas.

(12) In the method for manufacturing an n-type SnS thin film according to any one of the above (7) to (9), a halogen element is supplied by using a SnS target containing 0.01 at % to 3 at % of a halogen element for forming the SnS thin film.

(13) A manufacturing apparatus of an n-type SnS thin film according to an aspect of the invention uses the manufacturing method according to any one of the above (7) to (12).

Advantageous Effect

According to the aspect of the invention, it is possible to provide the n-type SnS thin film that has a high impurity activation rate and exhibits n-type conductivity, the photoelectric conversion element, the solar cell, the method for manufacturing an n-type SnS thin film, and the manufacturing apparatus of an n-type SnS thin film.

Figure 1:
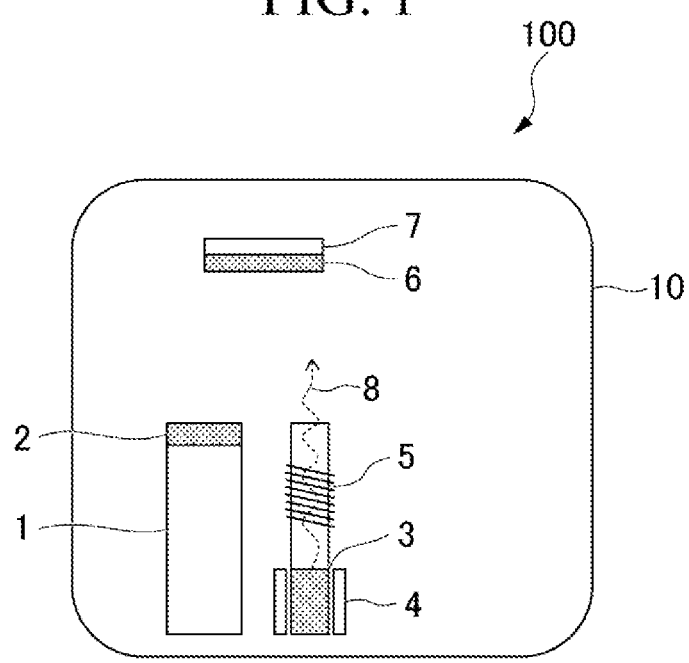
FIG. 1 is a schematic diagram of a sputtering apparatus.

DETAILED DESCRIPTION OF THE INVENTION n-Type SnS Thin Film

Hereinafter, an n-type SnS thin film according to the present embodiment will be described. N-type SnS according to the present embodiment has n-type conductivity. The SnS thin film is preferably mainly composed of SnS. The expression "mainly composed of SnS" means that only SnS is confirmed and heterophases such as $SnS_2$, $Sn_2S_3$, and $SnO_2$ are not confirmed by X-ray diffraction analysis. SnS according to the present embodiment may contain the heterophases such as $SnS_2$, $Sn_2S_3$, and $SnO_2$ as long as SnS exhibits n-type conductivity and achieves effects of the invention. In addition, it is preferable that the n-type SnS thin film according to the present embodiment contains a harmful element as less as possible for safety.

Average Thickness: 0.100 μm to 10 μm

An average thickness of the n-type SnS according to the present embodiment is 0.100 μm or more. The average thickness of the n-type SnS is preferably 1 μm or more. The average thickness of the n-type SnS is more preferably 3 μm or more. When the average thickness of n-type SnS is less than 0.100 μm, light cannot be sufficiently absorbed. The average thickness of the n-type SnS is 10 μm or less. The average thickness of the n-type SnS is preferably 7 μm or less. The average thickness of the n-type SnS is more preferably 4 μm or less. When the average thickness of the n-type SnS is more than 10 μm, a problem arises in that light does not reach the vicinity of a homojunction interface, and a problem arises in that electrons and holes generated by light irradiation cannot be extracted to the outside due to recombination.

Atomic Ratio (S/Sn) of S Content to Sn Content: 0.85 to 1.10

An atomic ratio (S/Sn) of a S content (at %) to a Sn content (at %) of the n-type SnS thin film according to the present embodiment is 0.85 to 1.10. When the S/Sn is 0.85 to 1.10, the n-type SnS thin film can obtain a high activation rate.

The average thickness of the n-type SnS can be measured by the following method using fluorescent X-ray analysis. For example, fluorescent X-rays of the n-type SnS thin film are measured using a fluorescent X-ray analyzer (for example, MaXXi 5 manufactured by Matrix Metrologies). The average thickness of the n-type SnS is obtained from the obtained fluorescent X-rays by a fundamental parameter method.

Ratio ($\alpha_{1.1}/\alpha_{1.6}$) of Absorption Coefficient $\alpha_{1.1}$ at Photon Energy of 1.1 eV to Absorption Coefficient $\alpha_{1.6}$ at Photon Energy of 1.6 eV. 0.200 or Less In the n-type SnS thin film according to the present embodiment, a ratio ($\alpha_{1.1}/\alpha_{1.6}$) of an absorption coefficient $\alpha_{1.1}$ at a photon energy of 1.1 eV to an absorption coefficient $\alpha_{1.6}$ at a photon energy of 1.6 eV is 0.200 or less. When the $\alpha_{1.1}/\alpha_{1.6}$ is 0.200 or less, the SnS thin film exhibits n-type conductivity and can have an activation rate of 60% or more. The $\alpha_{1.1}/\alpha_{1.6}$ is preferably 0.100 or less. The $\alpha_{1.1}/\alpha_{1.6}$ may be 0.005 or more.

In the n-type SnS thin film according to the present embodiment, an absolute value of an absorption coefficient at a photon energy of 1.0 eV is preferably $1.0 \times 10^4$ cm$^{-1}$ or less. It is preferable that the absolute value of the absorption coefficient at the photon energy of 1.0 eV is $1.0 \times 10^4$ cm$^{-1}$ or less since a defect in which Sn occupies a place to be occupied by S is reduced. A lower limit of the absolute value of the absorption coefficient at the photon energy of 1.0 eV is not particularly limited, and may be, for example, $1.0 \times 10^3$ cm$^{-1}$ or more.

An absorption coefficient α of the SnS thin film can be measured, for example, by the following method. Transmittance T (%) and reflectance R (%) of the SnS thin film at a measurement wavelength of 192 nm to 3200 nm are measured using a spectrophotometer (for example, U4100 manufactured by Hitachi High-Technologies Corporation). The absorption coefficient α can be obtained by calculating from the following equation (1) using the obtained transmittance T and reflectance R of the SnS thin film, and an average thickness (cm) t of the n-type SnS.

$$\alpha = (1/t) \times \ln((100-R)^2/(100 \times T)) \quad (1)$$

0.002 at % to 0.2 at % of Halogen Element

In the n-type SnS thin film according to the present embodiment, an impurity for exhibiting n-type conductivity is not particularly limited. Examples of such impurity include a halogen element and Pb. The n-type SnS thin film according to the present embodiment preferably contains 0.002 at % to 0.2 at % of the halogen element. When the halogen is 0.002 at % to 0.2 at %, a sufficient carrier density is obtained. The halogen element is preferably any one or more of Cl, Br, and I. In particular, the halogen element is preferably Cl and Br.

A content of the impurity such as the halogen element in the n-type SnS thin film can be measured by a time-of-flight secondary ion mass spectrometer (for example, TOF-SIMS-5 manufactured by ION TOF-GmbH). For example, a depth direction profile of the halogen element of the n-type SnS thin film is measured using TOF-SIMS. In the obtained depth profile of the halogen element, an average value of concentrations of the halogen element in a region where the concentrations of the halogen element are stable is defined as a content of the halogen element in a range from a surface to a position of ¼ of a thickness of the n-type SnS thin film to a range from the surface to a position of ½ of the thickness of the n-type SnS thin film along a depth direction.

Method for Manufacturing n-Type SnS Thin Film

Next, the method for manufacturing an n-type SnS thin film will be described. The method for manufacturing an n-type SnS thin film according to the present embodiment includes forming the SnS thin film by a vacuum film forming method in the presence of atomic S and the halogen element. The method for forming the SnS thin film is not particularly limited as long as the method is the vacuum film forming method, and sputtering, vapor deposition, a proximity sublimation method, or the like can be used. The SnS thin film is preferably formed by the sputtering. A manufacturing apparatus of the n-type SnS thin film is not particularly limited as long as the method for manufacturing an n-type SnS thin film according to the present embodiment is used. When a thin film is formed by the sputtering, the thin film can be formed by, for example, a sputtering apparatus 100 as shown in FIG. 1.

The sputtering apparatus 100 shown in FIG. 1 includes a sputtering cathode 1, a SnS target 2 on the sputtering cathode 1, a heater 4 for vaporizing solid S powder 3, a high-frequency coil (RF coil) 5 for converting vaporized S into plasma, and a chamber 10. When a SnS thin film 6 is formed on a substrate 7 by the sputtering, for example, the SnS thin film 6 can be formed by the following method. Undoped SnS is prepared as SnS target, Ar is used as sputtering gas, quartz glass is used as the substrate 7, a substrate temperature is set to 220° C. to 340° C., and the SnS thin film 6 is formed in the presence of atomic S 8 and the halogen element (film forming rate: 8 nm/min). Here, "in the presence of atomic S and the halogen element" means that the atomic S and the halogen element are present in a region where the SnS thin film is formed. It is preferable that the substrate temperature is in a range of 220° C. to 340° C. since the formed SnS thin film 6 easily exhibits n-type conductivity.

Halogen Element

In the method for manufacturing an n-type SnS thin film according to the present embodiment, the halogen element is supplied into a film forming atmosphere. A method for supplying the halogen element is not particularly limited as long as the content of the halogen element in the n-type SnS thin film is 0.002 at % to 0.2 at %. As the method for supplying the halogen element, the halogen element may be supplied by forming the n-type SnS thin film using a SnS target containing 0.01 at % to 3 at % of the halogen element. In addition, halogen gas may be directly supplied into the film forming atmosphere before or during formation of the n-type SnS thin film. A flow rate of the halogen gas is, for example, 0.01 to 5 sccm. In addition, the halogen element may be supplied into the film forming atmosphere by irradiating SnS target containing the halogen element with the plasma before the formation of the n-type SnS thin film. A supply amount of the halogen element can be appropriately adjusted based on conditions such as an exhaust speed of a vacuum pump and a size of the chamber 10.

When SnS target containing the halogen element is irradiated with the plasma, it is preferable to irradiate SnS (doped SnS) containing 5 at % to 15 at % of the halogen element with the plasma. By irradiating the doped SnS with the plasma before film formation, a small amount of the halogen element (for example, Cl) remains in the manufacturing apparatus (in the chamber 10), and halogen can be supplied into an atmosphere in the film formation performed thereafter in advance. Accordingly, a concentration of the halogen element in the n-type SnS thin film can be controlled in a range of 0.002 at % to 0.2 at %.

Atomic S

In the method for manufacturing an n-type SnS thin film according to the present embodiment, the atomic S 8 is supplied into the film forming atmosphere. When S is simply vaporized and supplied, the vaporized S is in a cluster form having low reactivity. Therefore, a defect caused by S deficiency of the SnS thin film 6 cannot be reduced. On the other hand, the atomic S 8 has higher reactivity than the vaporized S, and can efficiently reduce the defect caused by the S deficiency of the SnS thin film 6.

A method for supplying the atomic S 8 is not particularly limited, and includes, for example, heating the solid S powder 3, bringing the vaporized S into a plasma state by a high-frequency coil 5, and then supplying the vaporized S with a plasma state to a deposition portion of the SnS thin film 6, or supplying H$_2$S gas to the deposition portion of the SnS thin film 6. When the H$_2$S gas is used, the H$_2$S gas may be brought into a plasma state by the high-frequency coil 5 and then supplied to the deposition portion of the SnS thin film 6.

Next, a method for supplying the solid S powder 3 after bringing the solid S powder 3 into the plasma state (S plasma) will be described. For example, the solid S powder 3 can be brought into the plasma state by the following method. The solid S powder 3 is heated at 75° C. to be vaporized. The vaporized S is brought into the plasma state by the high frequency coil 5, and the atomic S 8 is supplied. At this time, power of the high-frequency coil 5 is about 10 to 100 W, and a flow rate of argon gas supplied to the high-frequency coil 5 is, for example, 1 to 20 sccm. Supplying Ar gas is preferable because plasma is stabilized. Conditions such as the power of the high-frequency coil 5 and the flow rate of the argon gas can be appropriately adjusted according to the size of the chamber 10 and the like.

A method for supplying $H_2S$ gas will be described. $H_2S$ is easily decomposed and can efficiently reduce the defect caused by the S deficiency in the SnS thin film 6. The flow rate of the $H_2S$ gas is preferably 0.01 to 10 sccm. The flow rate of the $H_2S$ gas can be appropriately adjusted based on conditions such as the exhaust speed of the vacuum pump and the size of the chamber 10. In addition, in order to further improve reactivity of the $H_2S$, the $H_2S$ gas may be brought into the plasma state in the same manner as the solid S powder 3.

The n-type SnS thin film according to the present embodiment has been described in detail above. The invention is not limited to such specific embodiments, and various modifications and changes are possible within the scope of the invention stated in the claims. In addition, the n-type SnS thin film according to the present embodiment can be used for a photoelectric conversion element such as a solar cell. For example, a photoelectric conversion element including the n-type SnS thin film according to the present embodiment may have a homo pn junction including the n-type SnS thin film according to the present embodiment and a p-type SnS thin film. In addition, a solar cell including the n-type SnS thin film according to the present embodiment may include the photoelectric conversion element having the above homo pn junction.

EXAMPLE

Next, the example of the invention will be described, but a condition in the example is an example condition adopted to confirm practicability and effects of the invention, and the invention is not limited to the example condition. The invention can adopt various conditions as long as the object of the invention is achieved without departing from the gist of the invention.

Example

Cl was supplied into a chamber by irradiating a Cl-doped SnS target with plasma in a sputtering chamber, and the Cl was supplied into a film forming atmosphere in film formation performed thereafter by leaving the Cl in the chamber. Specifically, a SnS target containing 10 at % of Cl was irradiated with plasma at a power of 40 W for 30 minutes using Ar (flow rate: 10 sccm) as sputtering gas, and the Cl was supplied into the chamber.

After the Cl was supplied into the film forming atmosphere, a quartz glass substrate was placed in a chamber, and while a SnS thin film was formed on the quartz glass substrate by sputtering, the SnS thin film was irradiated with S plasma to obtain a SnS thin film of Example. Sputtering was performed using undoped SnS as a target and Ar as a sputtering gas at a substrate temperature of 330° C. and at a film forming rate of 8 nm/min.

The SnS thin film was irradiated with S plasma using Sulfur Cracking Source manufactured by Oxford applied research in the following procedures. Solid S powder was vaporized by being heated to 75° C. with a heater. Next, S vaporized at a power of 50 W was converted into plasma while supplying Ar at a flow rate of 6 sccm to a high-frequency coil, and the SnS thin film during film formation was irradiated with S plasma.

Comparative Example

Cl was supplied into a chamber by irradiating a Cl-doped SnS target with plasma in a sputtering chamber, and the Cl was supplied into a film forming atmosphere in film formation performed thereafter by leaving the Cl. Specifically, a SnS target containing 10 at % of Cl was irradiated with plasma at a power of 40 W for 30 minutes using Ar (flow rate: 10 sccm) as sputtering gas, and the Cl was supplied into the chamber.

After the Cl was supplied into the chamber, a quartz glass substrate was placed in the chamber, and a SnS thin film was formed on the quartz glass substrate by sputtering to obtain a SnS thin film of Comparative Example. Sputtering was performed using undoped SnS as a target and Ar as a sputtering gas at a substrate temperature of 330° C. and at a film forming rate of 6 nm/min.

X-ray Diffraction Analysis

Identification of a SnS thin film was performed by X-ray diffraction. For the X-ray diffraction, the SnS thin film of Example and the SnS thin film of Comparative Example were measured by a θ-2θ method using D8 Discover manufactured by Bruker. The obtained results are shown in (a) and (b) of FIG. 2. In addition, X-ray diffraction patterns of SnS of ICSD are shown in (c) of FIG. 2.

Film Thickness Measurement

The film thickness was measured with a fluorescent X-ray analyzer (MaXXi 5 manufactured by Matrix Metrologies). An average thickness of the SnS thin film was obtained by the fundamental parameter method from fluorescent X-rays obtained by measuring the SnS thin film of Example and the SnS thin film of Comparative Example. The obtained results are shown in Table 1.

Fluorescent X-Ray Analysis

Chemical compositions of the SnS thin film of Example and the SnS thin film of Comparative Example were measured using a fluorescent X-ray analyzer (MaXXi 5 manufactured by Matrix Metrologies).

Hall Measurement

Electric conductivity and hall coefficients of the SnS thin film of Example and the SnS thin film of Comparative Example, and electric conductivity and hall coefficients in a temperature range of 60 K to 300 K were measured by a van der Pauw method using a hall measurement system (RESITEST8300 manufactured by Toyo Corporation). A gold thin film having a thickness of about 100 nm was used as an electrode. From these results, a conductivity type, a carrier density, and mobility were evaluated. The obtained results are shown in Table 1.

Light Absorption Spectrum Measurement

Transmittance T (%) and reflectance R (%) of the SnS thin film at a measurement wavelength of 192 nm to 3200 nm were measured using a spectrophotometer (for example, U4100 manufactured by Hitachi High-Technologies Corporation). Using the transmittance T and the reflectance R at each photon energy of the obtained SnS thin film and the average thickness t (cm) of the n-type SnS, an absorption coefficient was calculated from the above equation (1) to obtain an absorption spectrum. From the obtained absorption spectrum, the ratio ($\alpha_{1.1}/\alpha_{1.6}$) of the absorption coefficient $\alpha_{1.1}$ at the photon energy of 1.1 eV to the absorption coefficient $\alpha_{1.6}$ at the photon energy of 1.6 eV and the absolute value $\alpha_{1.0}$ of the absorption coefficient at the photon energy of 1.0 eV of the SnS thin film of Example and the SnS thin film of Comparative Example were calculated. The obtained results are shown in Table 1.

TOF-SIMS Measurement

A content of a halogen element was measured by a time-of-flight secondary ion mass spectrometer (TOF-SIMS-5 manufactured by IONTOF-GmbH). Specifically, depth direction profiles of S, Sn, and Cl of the SnS thin film of Example and the SnS thin film of Comparative Example were measured using TOF-SIMS. In the depth profile of the obtained halogen element, an average value of Cl concentrations was calculated in a range from a surface to a position of 70 nm in depth to a range from the surface to a position of 110 nm in depth along the depth direction, and the calculated average value was defined as a content of the halogen element. The obtained results are shown in Table 1.

TABLE 1

Results

| | Example | Comparative Example |
|---|---|---|
| Film thickness (μm) | 0.250 | 0.195 |
| S/Sn | 1.029 | 0.998 |
| Conductivity type | n | p |
| Electric conductivity (Scm$^{-1}$) | 1 × 10$^{-1}$ | 1.8 × 10$^{-4}$ |
| Carrier density (cm$^{-1}$) | 2.6 × 10$^{18}$ | 6.1 × 10$^{14}$ |
| Mobility (cm$^2$V$^{-1}$s$^{-1}$) | 0.23 | 1.8 |
| $\alpha_{1.1}/\alpha_{1.6}$ | 0.077 | 0.255 |
| $\alpha_{1.0}$ (cm$^{-1}$) | 9.4 × 10$^3$ | 2.5 × 10$^4$ |
| Cl concentration (at %) | 0.018 | 0.022 |
| Activation rate | 65% | 0% |

Figure 2:
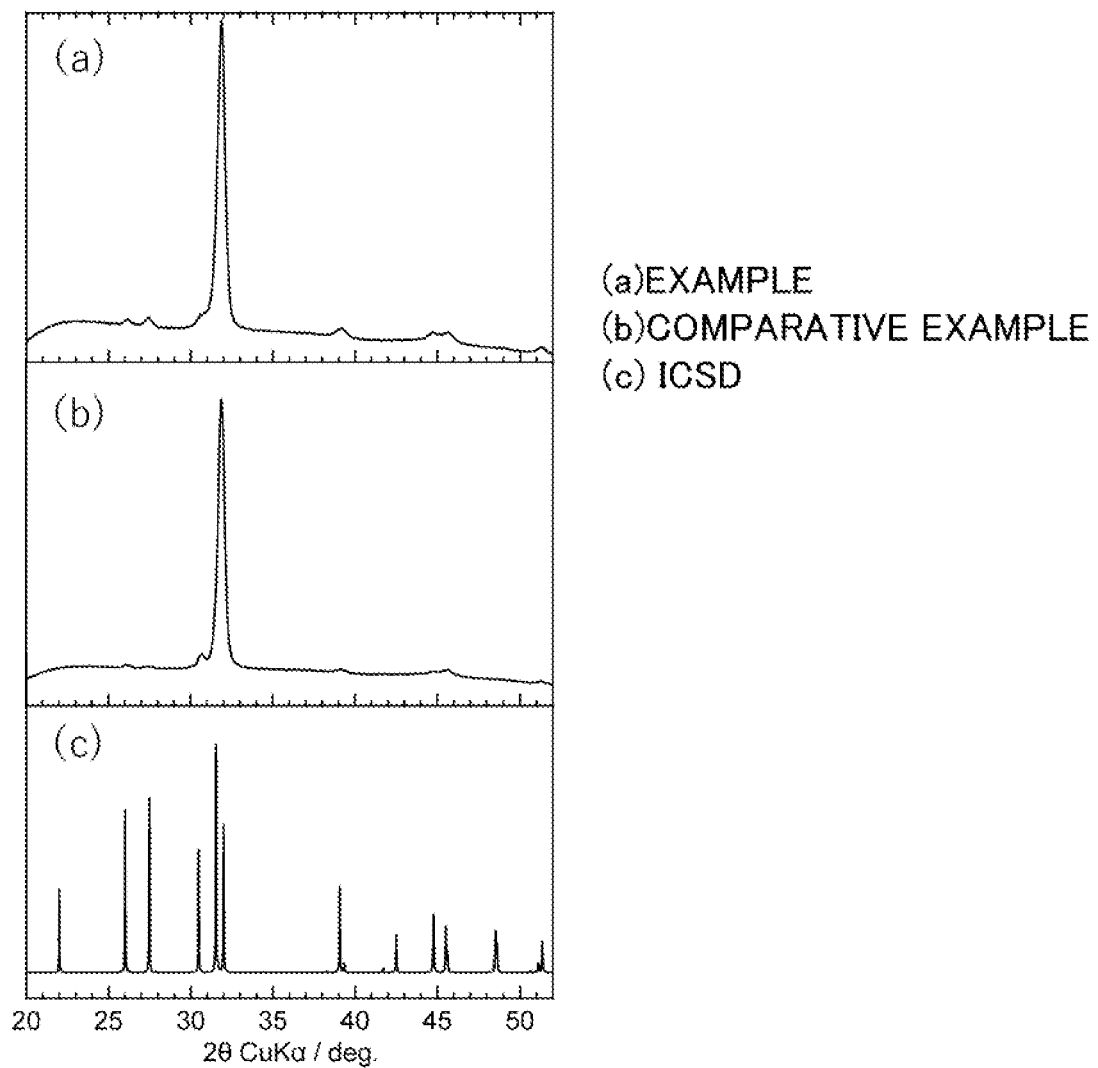
FIG. 2 is a diagram showing XRD measurement results of a SnS thin film of Example and a SnS thin film of Comparative Example and X-ray diffraction patterns of SnS in ICSD.

FIG. 2 shows results of XRD measurement of the SnS thin film of Example. A horizontal axis represents 2θ (°), and a vertical axis represents X-ray intensity. (a) of FIG. 2 shows a measurement result of the SnS thin film of Example, and (b) of FIG. 2 shows a measurement result of the SnS thin film of Comparative Example. All peaks in (a) and (b) of FIG. 2 were attributed to SnS. As shown in FIG. 2, there were no heterophases such as $SnS_2$, $Sn_2S_3$, and $SnO_2$. Thus, it was confirmed that the thin films of Example and Comparative Example were composed of SnS.

As shown in Table 1, the SnS thin film of Example in which the ratio ($\alpha_{1.1}/\alpha_{1.6}$) of the absorption coefficient $\alpha_{1.1}$ at the photon energy of 1.1 eV to the absorption coefficient $\alpha_{1.6}$ at the photon energy of 1.6 eV was 0.200 or less exhibited n-type conductivity. On contrast, the SnS thin film of Comparative Example in which the ratio ($\alpha_{1.1}/\alpha_{1.6}$) of the absorption coefficient $\alpha_{1.1}$ at the photon energy of 1.1 eV to the absorption coefficient $\alpha_{1.6}$ at the photon energy of 1.6 eV exceeded 0.200 exhibited p-type conductivity. In addition, an activation rate calculated from the Cl concentration and the carrier density of the SnS thin film of Example was 65%. Since an activation rate of an n-type SnS in the related art was several percent or less, it was found that the SnS thin film of the present embodiment can be made into an n-type semiconductor with Cl having an extremely low concentration of 0.018 at %.

Since a non-doped SnS semiconductor generally exhibits p-type, a homojunction can be implemented by an n-type SnS semiconductor of the invention exhibiting n-type. Therefore, the n-type SnS semiconductor of the invention is useful for the photoelectric conversion element for a homojunction type SnS solar cell having a pn junction with a p-type non-doped SnS semiconductor. In addition, since SnS semiconductor does not contain an expensive and rare element, SnS semiconductor can be expected as an inexpensive photoelectric conversion material.

INDUSTRIAL APPLICABILITY

Since the n-type SnS thin film of the invention is expected to be used in the photoelectric conversion element, the solar cell, or the like, the n-type SnS thin film has high industrial applicability.

What is claimed is:

1. An n-type SnS thin film having n-type conductivity, wherein
the n-type SnS thin film contains 0.002 at % to 0.2 at % of a halogen element,
the n-type SnS thin film is formed by sputtering, S plasma being irradiated on a forming film during film formation,
an average thickness is 0.100 μm to 10 μm,
a ratio ($\alpha_{1.1}/\alpha_{1.6}$) of an absorption coefficient $\alpha_{1.1}$ at a photon energy of 1.1 eV to an absorption coefficient $\alpha_{1.6}$ at a photon energy of 1.6 eV is 0.200 or less,
an atomic ratio (S/Sn) of a S content to a Sn content is 0.85 to 1.10, and
an activation rate of the halogen element is 60% or more.
2. The n-type SnS thin film according to claim 1, wherein an absolute value of an absorption coefficient at a photon energy of 1.0 eV is 1.0×10$^4$ cm$^{-1}$ or less.
3. The n-type SnS thin film according to claim 1, wherein the halogen element is any one or more of Cl, Br, and I.
4. A photoelectric conversion element having a homo pn junction that includes the n-type SnS thin film according to claim 1, and a p-type SnS thin film.
5. A solar cell comprising:
the photoelectric conversion element according to claim 4.
6. The n-type SnS thin film according to claim 1, wherein the average thickness is 0.100 μm to 7 μm.
7. The n-type SnS thin film according to claim 1, wherein the average thickness is 0.100 μm to 4 μm.
8. The n-type SnS thin film according to claim 1, wherein the S plasma is supplied by plasmatizing solid S powder or $H_2S$ gas.
9. The n-type SnS thin film according to claim 1, wherein the ratio ($\alpha_{1.1}/\alpha_{1.6}$) of an absorption coefficient is 0.005 or more and 0.100 or less.
10. The n-type SnS thin film according to claim 2, wherein
an absolute value of an absorption coefficient at a photon energy of 1.0 eV is 1.0×10$^3$ cm$^{-1}$ or more.

* * * * *